United States Patent [19]
Urbish et al.

[11] Patent Number: 5,774,341
[45] Date of Patent: Jun. 30, 1998

[54] SOLDERLESS ELECTRICAL INTERCONNECTION INCLUDING METALLIZED HOOK AND LOOP FASTENERS

[75] Inventors: Glenn F. Urbish, Coral Springs; Robert W. Pennisi; William Boone Mullen, III, both of Boca Raton; Dale W. Dorinski, Coral Springs, all of Fla.

[73] Assignee: Motorola, Inc., Schaumburg, Ill.

[21] Appl. No.: 575,652

[22] Filed: Dec. 20, 1995

[51] Int. Cl.⁶ .............................. H01R 9/09; H05K 7/02
[52] U.S. Cl. .................... 361/774; 174/261; 361/749; 361/772; 361/776; 361/779; 439/74; 439/290
[58] Field of Search ............... 128/DIG. 15; 174/254, 174/259, 260, 261; 361/749, 760, 772–774, 776, 779, 782, 783, 807, 809, 811; 403/345, 364; 439/66, 67, 74, 77, 284, 81, 290, 291, 371

[56] References Cited

U.S. PATENT DOCUMENTS

| | | | |
|---|---|---|---|
| 3,585,569 | 6/1971 | Moran | 439/371 |
| 3,842,189 | 10/1974 | Southgate | 174/260 |
| 4,191,950 | 3/1980 | Levin et al. | 128/DIG. 15 |
| 4,239,046 | 12/1980 | Ong | 128/DIG. 15 |
| 4,793,814 | 12/1988 | Zifcak et al. | 439/66 |
| 5,136,470 | 8/1992 | Sheridon et al. | 361/749 |
| 5,457,610 | 10/1995 | Bernardoni et al. | 361/816 |
| 5,561,594 | 10/1996 | Wakefield | 361/772 |

*Primary Examiner*—Donald Sparks
*Attorney, Agent, or Firm*—Dale W. Dorinski

[57] ABSTRACT

A solderless electrical interconnection is made using electrically conductive hook fasteners (15) that are embedded in a substrate (12). The upper part (20) of the fastener is exposed on the top side of the substrate, the central part (22) is embedded within the substrate itself, and the lower or hook portion (17) of the fastener protrudes from the bottom side of the substrate. Electrically conductive pathways (30), defined on the top side of the substrate, make contact with the exposed upper part of the hook fastener. The electrically conductive runners on the top side have a continuous signal path through the substrate to the bottom side of the substrate via the electrically conductive hook fastener. The hook fastener (15) is engaged to electrically conductive loop fasteners (60) on a second substrate (70) in order to create a solderless electrical interconnection and mechanical interlocking between the two substrates.

26 Claims, 4 Drawing Sheets

SOLDERLESS ELECTRICAL INTERCONNECTION INCLUDING METALLIZED HOOK AND LOOP FASTENERS

CROSS REFERENCE TO RELATED APPLICATIONS

This application is related to U.S. application Pat. No. 5,457,610, issued Oct. 10, 1995, by Bernardoni, et al., entitled "Low Profile Mechanical Interconnect System Having Metallized Loop and Hoop Area," and assigned to Motorola, Inc., and to U.S. application Ser. No. 08/575,945, by Urbish, et al., entitled "Multipoint Electrical Interconnection," filed concurrently herewith, and assigned to Motorola, Inc.

TECHNICAL FIELD

This invention relates in general to systems for providing electrical and mechanical interconnections and more specifically to a solderless electrical interconnect system.

BACKGROUND

Historically, solder and solder joints have been the method of choice for providing electrical and mechanical interconnections in electrical and electronic devices. For example, the metal lead or termination of an electrical component, such as a resistor, capacitor or transistor, is typically soldered with an alloy of tin and lead to the copper pad of the printed circuit board. This operation, well known to those skilled in the art, is typically accomplished at temperatures of 200°–300° C. in the presence of a flux. Upon cooling, the solder solidifies and provides an electrically conductive pathway between the resistor and the copper pad on the printed circuit board. The solder is a rigid material that provides mechanical interconnection between the component and the circuit board. However, the high temperatures needed to create a reliable solder joint can sometimes be detrimental to the component of interest. Furthermore, the rigid nature of solder creates numerous problems in that stresses between the component and the circuit board are not easily relieved, thus leading to mechanical fracture and failure of the electrical interconnect. Most solders contain a significant proportion of lead, a known toxic material, and in recent years, there has been significant effort in the industry to reduce the lead content in solder. Unfortunately, in most cases, this leads to a compromise in processing and mechanical properties of the solder joint, and a good lead-free substitute for conventional solder is yet to be found.

More recently, components have been attached to circuit boards using conductive adhesives, such as epoxies filled with materials like silver, copper, nickel, chrome, platinum, gold, and so forth. While this solves the problem of high temperatures and lead toxicity, conductive adhesives are significantly more expensive than solder and pose their own inherent reliability problems. In addition, they do not easily lend themselves to mass production as solder does.

Clearly, it would be desirable to provide an electrical and mechanical interconnection that has ease of assembly, solves the problem of lead toxicity, and does not need to be assembled at high temperatures. Furthermore, an electrical interconnection that could be removed and/or repaired easily would also be desirable.

DETAILED DESCRIPTION OF THE EMBODIMENT

Figure 1:
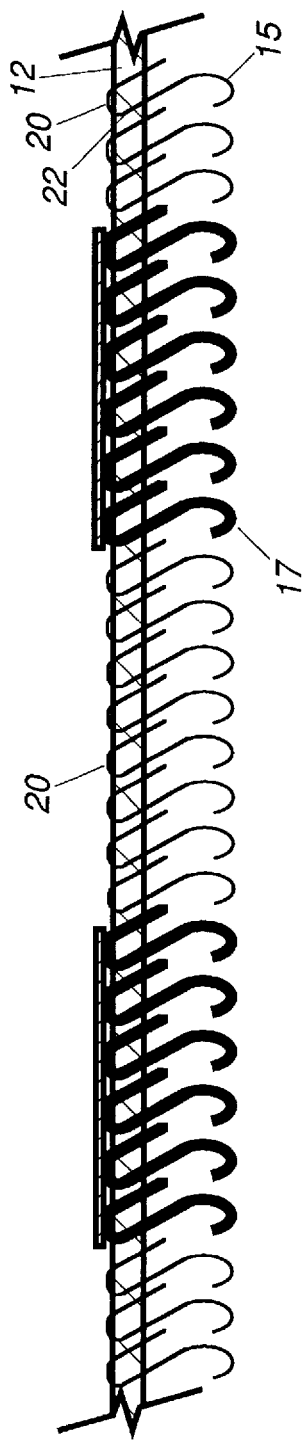
FIG. 1 is a cross-sectional view of the solderless electrical interconnection substrate in accordance with the invention.

A solderless electrical interconnection is made using electrically conductive hook fasteners that are embedded in a substrate. The upper part of the fastener is exposed on the top side of the substrate, the central part is embedded within the substrate itself, and the lower or hook portion of the fastener protrudes from the bottom side of the substrate. Electrically conductive pathways, defined on the top side of the substrate, make contact with the exposed upper part of the hook fastener. In this way, the electrically conductive runners on the top side then have a continuous signal path through the substrate to the bottom side of the substrate via the electrically conductive hook fastener. The hook fastener may optionally then be engaged to electrically conductive loop fasteners on a second substrate in order to create a solderless electrical interconnection. This configuration provides both selective electrical conductivity and also a mechanical mounting or interlocking between the two substrates in order to hold them in place.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a solderless electrical interconnection 10 is formed on a substrate 12 that is a dielectric or insulating material. An electrical pathway is provided through the substrate 12 by a series of electrically conductive hook fasteners 15. The hook fasteners 15 form one-half of the well known VELCRO® hook-and loop type fastening system. In the embodiment shown in FIG. 1, the electrical interconnection is formed by weaving metallic filaments in a manner which provides loops on one side of the substrate 12. The substrate 12 is typically a material woven from threads of material such as NOMEX®, polyester, nylon, or aramide fibers. The threads which form the woven fabric are typically a few microns thick, while those which form the loops are considerably thicker, for example in the range of about 20 to about 150 microns, and preferably from between 50 and 120 microns. These loops are then cut near their outer ends to provide hooks 17 which project unidirectionally from one side of the substrate 12 and are typically nearly perpendicular to that side. The other side of the substrate 12 is substantially planer and flat for configuration of circuit runners. Typical fibers used for the electrically conductive hook fasteners 15 are steel, nickel, silver, and various alloys of these materials, or other natural or synthetic fibers such as nylon coated with various metals such as nickel, aluminum, silver, gold, chrome or copper. Woven substrates containing metal fibers are commercially available under the trademark VELCRO® from Velcro U.S.A., Inc. This type of fastening system is also known as "hook and pile." As is well know, these types of VELCRO® type fasteners will interlock with a strong gripping force and they may be readily separated by peeling back one or the other of the substrates by applying a peeling force in a direction substantially parallel to the plane of the interface between them. Thus, the hook-type fasteners 15 in the substrate 12 effectively and releaseably interconnect to loop-type fasteners (not shown) in a mating substrate. It should be understood that any other suitable type of releaseable fasteners may be equally employed and that the hook-type fasteners and the loop-type fasteners may be identical, i.e., they may all comprise hook-type fasteners which will engage one with the other with suitable gripping force. Thus, as used herein and in the claims, references to "hook- and loop-" type fasteners is intended to include other configurations of VELCRO® type fasteners, such as hook-and-hook type fasteners. It will be appreciated that VELCRO® type fasteners are available in a variety of configurations and that other variations of this fastening scheme should be considered to fall within the scope of the disclosure and claims. Thus, the electrically conductive hooks and loops provide an electrically conductive and releaseable contact between two substrates.

As can clearly be seen from FIG. 1, the hook-type fasteners 15 tend to approximate the shape of the letter "J." That is, the hook fasteners 15 have a head portion 20 that is exposed on one surface of the substrate 12. Typically, the head portion 20 protrudes slightly above the surface or is coplanar to that surface, but in any case, it is exposed on the top surface. A shank portion 22 of the hook is embedded or buried within the substrate 12 such that the hook fastener 15 extends from one side of the substrate to the other. Protruding now from the bottom side of the substrate is the hook portion 17 of the hook fastener that provides the mechanical gripping to interlock to a corresponding pile fastener. As can be seen in the drawings, a typical substrate contains numerous hook portions 17 disposed in an essentially regular matrix and typically about 1–2 mm apart from each other.

Figure 2:
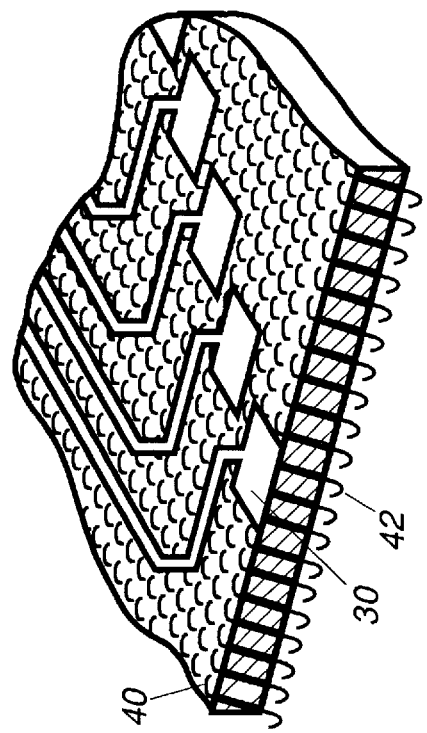
FIG. 2 is a partial isometric view of the substrate shown in FIG. 1.

Referring now to FIG. 2, the solderless electrical interconnection 10 also has one or more metallized circuit pads 30 that overlay one or more of the electrically conductive hook fasteners 15. The top side of the substrate is selectively metallized to produce a circuit pattern similar to that found on printed circuit boards and other microelectronic circuits, that is, it contains a distinctive pattern of runners, traces and metal circuit pads 30. The top surface is not entirely conductive, but is selectively metallized in order to provide the desired circuit pattern. Substantial portions of the top surface remain unmetallized and are non-conductive. Those electrically conductive hook fasteners 15 that are not underlying a metallized area do not provide an electrical interconnection because there is no circuit path on the top side of the substrate connected to them. For example, the head portion of hook fastener 40 is not connected to any portion of any metallized circuit pattern and, thus, any attempt to connect the hook portion of hook fastener 40 to circuitry on another substrate would not create a conductive circuit path. In contrast, hook fasteners 42 underlying the metallized circuit pad 30 clearly would provide a conductive path from the metallized circuit pad through the substrate and down to the hook portion 17 on the bottom side and hence, to a contact member on a mating electrical partner. This scheme of creating a selectively metallized surface on the top side of an electrically non-conductive substrate containing electrically conductive hook fasteners has been hitherto unseen in the prior art. U.S. Pat. No. 5,457,610, assigned to Motorola Inc., describes a substrate having hook and loop fasteners with a selectively metallized circuit pattern on one side. However, that disclosure only provides electrical conductivity on one side of the substrate, as the main body of the hook fastener is made of an electrically non-conductive material. Thus, it does not provide side-to-side electrical interconnection. Likewise, the electrically conductive hoop and loop fasteners available from Velcro U.S.A., Inc. while providing electrical conductivity through the fabric, do not provide any means for creating a circuit pattern on either side of the fabric. The instant invention provide a novel means of creating side-to-side electrical interconnection heretofore unseen in the art.

Figure 3:
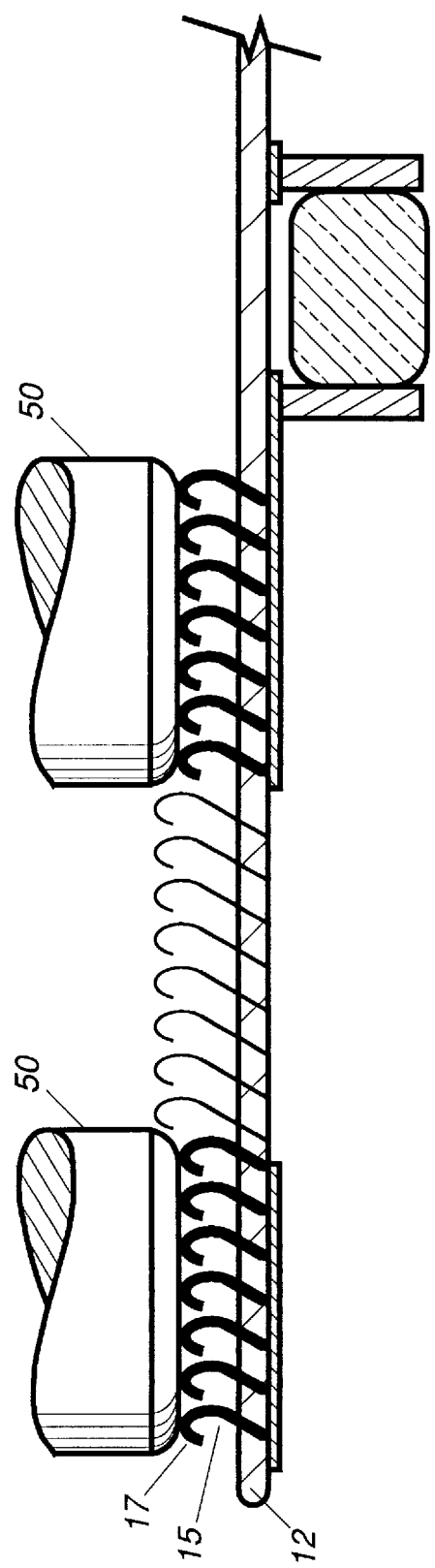
FIG. 3 is a cross-sectional view of the solderless electrical interconnection in accordance with the present invention.

FIG. 3 shows another embodiment wherein the electrically conductive hook fasteners 15 protrude from one side of the substrate 12, and rather than mate with a loop or pile portion as is conventionally known with regular VELCRO®, provide electrical contact to a mating contact member of another component. The component contains an electrically conductive portion 50, for example, a terminal, that is mechanically pressed up against the hook portion 17 and depresses or deforms that portion in order to provide contact between the terminal and the electrically conductive hook fasteners.

Figure 4:
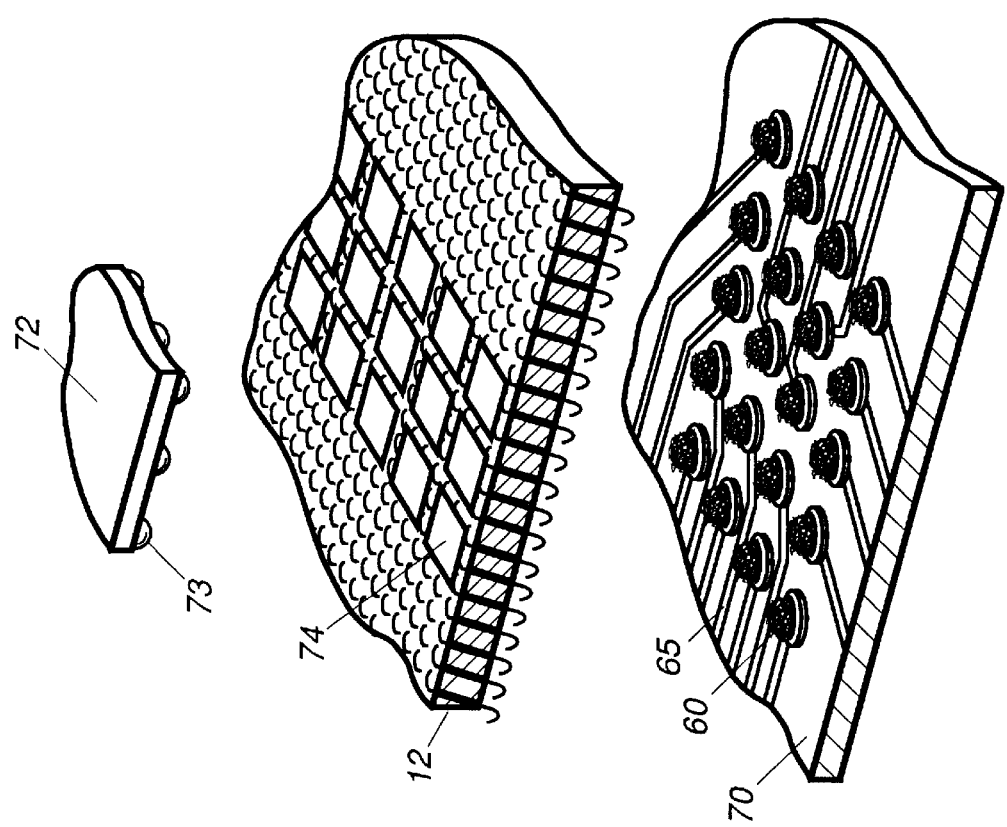
FIG. 4 is an exploded view of another embodiment of a solderless electrical interconnection in accordance with the invention.

Referring now to FIG. 4, the mechanism whereby the hook fasteners grip the loop fasteners 60 is shown. In this embodiment, the loop or pile portion 60 is configured on the printed circuit board 70 to which the electrical interconnection is to be made. Provision for the loop fastener 60 can be made either by selectively depositing discrete portions of the loop material on the desired pads of the circuit board or a larger piece of the loop fastener material may be disposed over a plurality of contact pads on the printed circuit board and desired areas selectively metallized in order to add conductivity to selected portions of the loop fasteners. When the substrate 12 is brought into proximity with the printed circuit board 70 and pressed against it, the hooks mechanically engage with the corresponding areas of the loop fastener 60 and provide selective electrical conductivity between the substrate 12 and the printed circuit board 70. In this way, a plurality of solderless electrical interconnections may be formed between the circuit pattern 65 on the top side of the substrate 12 and the circuit pattern 65 on the printed circuit board 70. Because the VELCRO® interconnect system is releaseable, the solderless electrical interconnection system 10 may be easily removed for whatever reason. In addition, it can be seen that this process is easily performed and does not require solder that contains lead or other toxic materials. Further, this operation is performed at ambient conditions and does not require high temperatures which may degrade sensitive electronic components. The substrate 12 may be used as an interposer to provide interconnection between a semiconductor device 72 and the printed circuit board 70. Typically, the device 72 is connected by bumps 73 on the device and corresponding pads 74 on the substrate.

Figure 5:
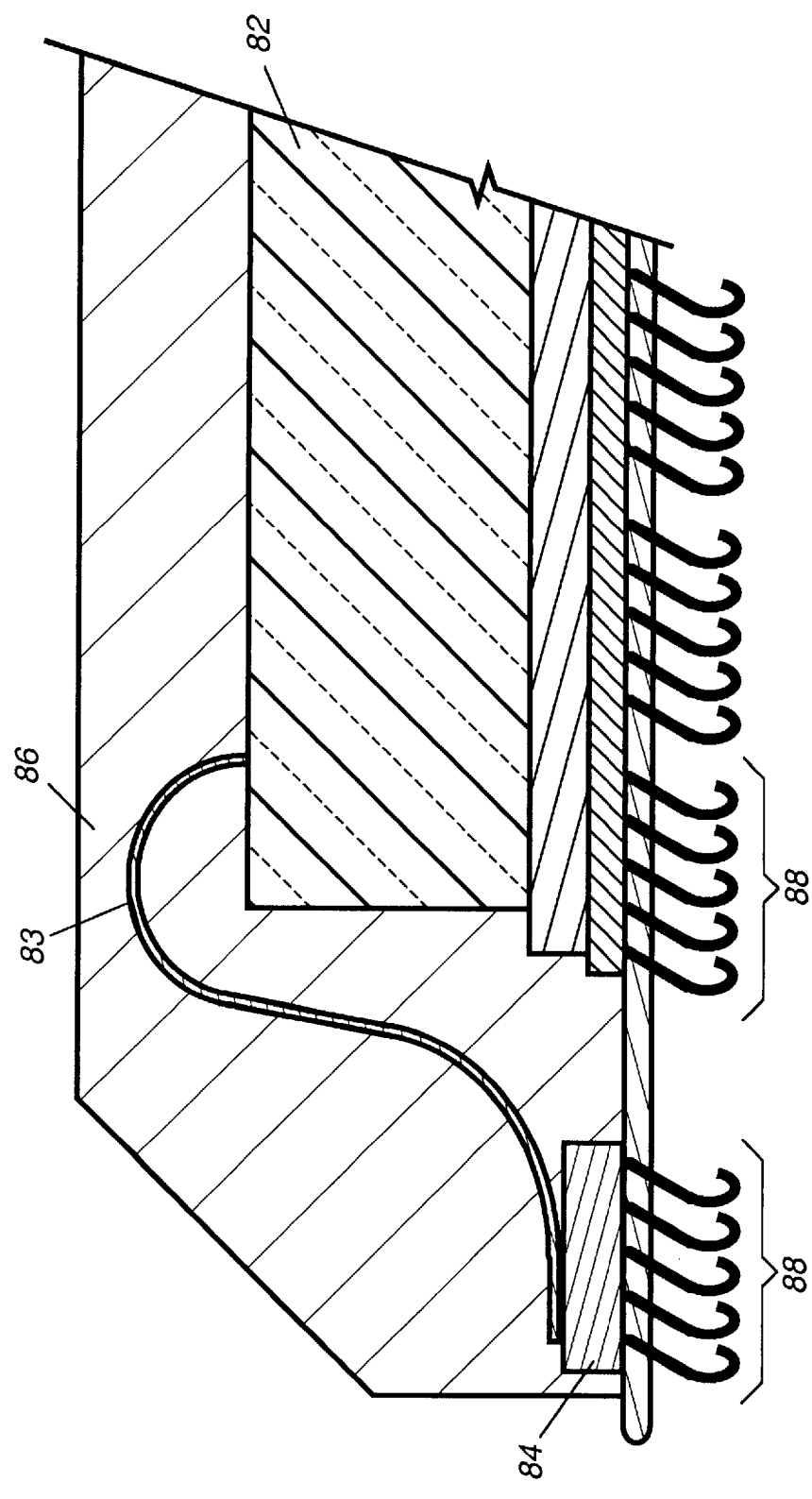
FIG. 5 is a cross-sectional view of a solderless electrical interconnection as used in a pad grid array carrier in accordance with the invention.

FIG. 5 shows another embodiment of the invention, a leadless chip carrier package 80 formed using the solderless interconnection of the instant invention. Similarly to that explained above, a circuit pattern is formed on a substrate such that selected areas of the circuit pattern are in contact with selected one or more electrically conductive hook fasteners. An integrated circuit 82 is then bonded to the substrate in conventional fashion and electrical interconnections, for example, wirebonds 83, are made between the substrate pads 84 and the integrated circuit. If desired, a cover 86 is placed over the integrated circuit, such as transfer molding or glob topping. In this case, the cover would encapsulate the integrated circuit and the associated wirebonds and wirebond pads, thus rendering substantial rigidity to the leadless chip carrier package 80. The various groups 88 of the electrically conductive hook fasteners then mate to corresponding portions of electrically conductive loop fasteners on the main printed circuit board, thus providing the electrical interconnection.

In alternate embodiments of the invention, a dielectric material is placed on the top side of the substrate in areas where there is no circuit pattern. This effectively covers the head portion 20 of the unused electrically conductive hook fasteners with a dielectric material, thus insulating them from contact with other electrically conductive materials. In another embodiment, selected hook fasteners may be removed from the substrate in an appropriate manner where electrical conductivity is not desired. For example, those hook fasteners that do not make direct contact with a portion of the circuit pattern, the desired portion of the circuit pattern, are deleted by removing them from the system. This may be accomplished in a number of ways. For example, the hook fasteners may only be located in desired locations to begin with, or the hook portion of the fastener may be removed by use of a laser, or they may be selectively cut out using mechanical means.

In summary, it can be seen that a solderless electrical connection has been provided that creates a substantial improvement over the known art. The use of solder, which traditionally contains toxic materials such as lead, has been eliminated, thus reducing a known health hazard. Further, since the solderless interconnection can be performed at ambient temperatures, dangers due to thermal degradation of sensitive electronic components are eliminated. Thirdly, the inner connection scheme of the instant invention is removable, repairable, and releaseable. By selectively defining a circuit pattern on one side of a substrate containing metallic threads or fibers formed in the shape of hook fasteners, a dielectric substrate is created that provides the solderless electrical interconnection.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A solderless electrical interconnection having electrically conductive hook fasteners in a first substrate and electrically conductive loop fasteners on a second substrate, comprising:

electrically conductive hook fasteners generally formed in the shape of a 'J' and having a head portion, a shank portion, and a hook portion;

a first substrate having the hook fasteners embedded therein, the head portion exposed on a first side of the substrate, the shank portion embedded within the substrate, and the hook portion protruding out of an opposing second side of the substrate;

the head portion of selected electrically conductive hook fasteners electrically connected to a metal circuit pad that is formed on the first side of the substrate to provide an electrical pathway between the metal circuit pad and the hook portion of the selected electrically conductive hook fasteners; and the hook portion of the selected electrically conductive hook fasteners mating and interlocking to electrically conductive loop fasteners on a second substrate to mechanically connect the first substrate to the second substrate and to provide an electrical connection from the metal circuit pads to the electrically conductive loop fasteners.

2. The solderless electrical interconnection as described in claim 1, further comprising a plurality of electrically non-conductive hook fasteners, each of said electrically non-conductive hook fasteners extending through the substrate from the first side to the second side.

3. The solderless electrical interconnection as described in claim 2, wherein only those hook fasteners that are electrically connected to the metal circuit pads are electrically conductive.

4. The solderless electrical interconnection as described in claim 1, wherein the substrate is a dielectric material.

5. The solderless electrical interconnection as described in claim 4, wherein the substrate is a woven material.

6. The solderless electrical interconnection as described in claim 1, further comprising a dielectric coating over the head portion of those electrically conductive hook fasteners that are not electrically connected to the metal circuit pad.

7. The solderless electrical interconnection as described in claim 1, further comprising a circuit pattern selectively metallized on the first side of the substrate.

8. The solderless electrical interconnection as described in claim 1, wherein the hook fasteners are metal wires.

9. The solderless electrical interconnection as described in claim 1, wherein only hook fasteners that are electrically connected to the metal circuit pad are present.

10. A solderless electrical interconnection providing an electrical pathway between electrically conductive hook fasteners in a substrate and a corresponding electrical contact on a second member, comprising:

electrically conductive hook fasteners generally formed in the shape of a 'J' and having a head portion, a shank portion, and a hook portion;

the substrate having the hook fasteners embedded therein, the head portion exposed on a first side of the substrate, the shank portion embedded within the substrate, and the hook portion protruding out of an opposing second side of the substrate;

the head portion of selected electrically conductive hook fasteners electrically connected to a metal circuit pad on the first side of the substrate to provide an electrical pathway between the metal circuit pad and the hook portion of the selected electrically conductive hook fasteners; and the hook portion of the selected electrically conductive hook fasteners contacting said corresponding electrical contact on said second member to provide an electrical connection from the metal circuit pads to said corresponding electrical contact.

11. The solderless electrical interconnection as described in claim 10, further comprising a plurality of electrically non-conductive hook fasteners, each of said electrically non-conductive hook fasteners extending through the substrate from the first side to the second side.

12. The solderless electrical interconnection as described in claim 11, wherein only those hook fasteners that are electrically connected to the metal circuit pads are electrically conductive.

13. The solderless electrical interconnection as described in claim 10, wherein the substrate is a dielectric material.

14. The solderless electrical interconnection as described in claim 13, wherein the substrate is a woven material.

15. The solderless electrical interconnection as described in claim 10, further comprising a dielectric coating over the head portion of those electrically conductive hook fasteners which are not electrically connected to the metal circuit pad.

16. The solderless electrical interconnection as described in claim 10, further comprising a circuit pattern selectively metallized on the first side of the substrate.

17. The solderless electrical interconnection as described in claim 10, wherein the hook fasteners are metal wires.

18. The solderless electrical interconnection as described in claim 10, wherein only hook fasteners that are electrically connected to the metal circuit pad are present.

19. A solderless electrical interconnection for a leadless chip carrier having electrically conductive hook fasteners for connection to electrically conductive loop fasteners on a printed circuit board, comprising:

a circuit carrying insulating substrate having opposing first and second sides;

electrically conductive hook fasteners generally formed in the shape of a 'J' and having a head portion, a shank portion, and a hook portion;

said substrate having the hook fasteners embedded therein, the head portion exposed on the first side of the substrate, the shank portion embedded within the substrate, and the hook portion protruding out of the second side of the substrate;

a semiconductor device mounted on the first side of the substrate, said device having a plurality of I/O terminations electrically connected to the head portion of selected electrically conductive hook fasteners to provide an electrical pathway between the semiconductor device and the hook portion of the selected electrically conductive hook fasteners;

a transfer molded resin cover encapsulating the semiconductor device and covering a portion of the first side of the circuit carrying substrate, to form a leadless chip carrier; and such that the hook portion of the selected electrically conductive hook fasteners serves to mate and interlock with corresponding electrically conductive loop fasteners on the printed circuit board so as to electrically and mechanically connect the leadless chip carrier to the printed circuit board.

20. The solderless electrical interconnection as described in claim 19, further comprising a plurality of electrically non-conductive hook fasteners, each of said electrically non-conductive hook fasteners extending through the substrate from the first side to the second side.

21. The solderless electrical interconnection as described in claim 20, wherein only those hook fasteners that are electrically connected to the semiconductor device are electrically conductive.

22. The solderless electrical interconnection as described in claim 21, wherein the substrate is a woven material.

23. The solderless electrical interconnection as described in claim 19, further comprising a dielectric coating over the head portion of those electrically conductive hook fasteners which are not electrically connected to the semiconductor device.

24. The solderless electrical interconnection as described in claim 19, further comprising a circuit pattern selectively metallized on the first side of the substrate.

25. The solderless electrical interconnection as described in claim 19, wherein the hook fasteners are metal wires.

26. The solderless electrical interconnection as described in claim 19, wherein only hook fasteners that are electrically connected to the semiconductor device are present.

* * * * *